(12) United States Patent
Muramatsu et al.

(10) Patent No.: US 10,418,242 B2
(45) Date of Patent: Sep. 17, 2019

(54) SUBSTRATE TREATMENT METHOD USING A BLOCK COPOLYMER CONTAINING A HYDROPHILIC AND A HYDROPHOBIC POLYMERS

(71) Applicant: Tokyo Electron Limited, Tokyo (JP)

(72) Inventors: Makoto Muramatsu, Koshi (JP); Tadatoshi Tomita, Koshi (JP); Hisashi Genjima, Koshi (JP); Gen You, Koshi (JP); Takahiro Kitano, Koshi (JP)

(73) Assignee: Tokyo Electron Limited, Tokyo (JP)

( * ) Notice: Subject to any disclaimer, the term of this patent is extended or adjusted under 35 U.S.C. 154(b) by 108 days.

(21) Appl. No.: 15/512,614

(22) PCT Filed: Sep. 15, 2015

(86) PCT No.: PCT/JP2015/076101
§ 371 (c)(1),
(2) Date: Mar. 20, 2017

(87) PCT Pub. No.: WO2016/047493
PCT Pub. Date: Mar. 31, 2016

(65) Prior Publication Data
US 2017/0287749 A1    Oct. 5, 2017

(30) Foreign Application Priority Data

Sep. 24, 2014  (JP) .................. 2014-194167

(51) Int. Cl.
*H01L 21/027* (2006.01)
*H01L 21/033* (2006.01)
(Continued)

(52) U.S. Cl.
CPC ............ *H01L 21/0337* (2013.01); *C08J 7/18* (2013.01); *D06M 14/18* (2013.01); *G03D 5/003* (2013.01);
(Continued)

(58) Field of Classification Search
CPC ............ H01L 21/0337; H01L 21/0335; H01L 21/67173; H01L 21/6719; H01L 21/67167;
(Continued)

(56) References Cited

FOREIGN PATENT DOCUMENTS

JP    S63-316846 A    12/1988
JP    H11-065119 A    3/1999
(Continued)

OTHER PUBLICATIONS

International Search Report of the International Searching Authority dated Dec. 8, 2015 in corresponding international application No. PCT/JP2015/076101 (and English translation).

*Primary Examiner* — M. A. Golub-Miller
(74) *Attorney, Agent, or Firm* — Posz Law Group, PLC

(57) ABSTRACT

A substrate treatment method of treating a substrate using a block copolymer containing a hydrophilic polymer and a hydrophobic polymer, includes: a resist pattern formation step of forming a predetermined resist pattern by a resist film on the substrate; a thin film formation step of forming a thin film for suppressing deformation of the resist pattern on a surface of the resist pattern; a block copolymer coating step of applying a block copolymer to the substrate after the formation of the thin film; and a polymer separation step of phase-separating the block copolymer into the hydrophilic polymer and the hydrophobic polymer.

3 Claims, 11 Drawing Sheets

(51) Int. Cl.
| | |
|---|---|
| *G03F 7/40* | (2006.01) |
| *H01L 21/31* | (2006.01) |
| *C08J 7/18* | (2006.01) |
| *D06M 14/18* | (2006.01) |
| *G03D 5/00* | (2006.01) |
| *H01L 21/02* | (2006.01) |
| *H01L 21/67* | (2006.01) |
| *H01L 29/51* | (2006.01) |
| *H01L 29/66* | (2006.01) |
| *G03F 7/00* | (2006.01) |
| *H01J 37/32* | (2006.01) |
| *H05H 1/46* | (2006.01) |

(52) U.S. Cl.
CPC ............... *G03F 7/0002* (2013.01); *G03F 7/40* (2013.01); *H01J 37/3255* (2013.01); *H01J 37/32082* (2013.01); *H01L 21/027* (2013.01); *H01L 21/02043* (2013.01); *H01L 21/0335* (2013.01); *H01L 21/31* (2013.01); *H01L 21/6719* (2013.01); *H01L 21/67167* (2013.01); *H01L 21/67173* (2013.01); *H01L 21/67178* (2013.01); *H01L 29/511* (2013.01); *H01L 29/66545* (2013.01); *H05H 1/46* (2013.01)

(58) Field of Classification Search
CPC ......... H01L 29/66545; H01L 21/02043; H01L 21/67178; H01L 29/511; H01L 21/31; H01L 21/027

See application file for complete search history.

(56) References Cited

FOREIGN PATENT DOCUMENTS

| | | |
|---|---|---|
| JP | 2002-064054 A | 2/2002 |
| JP | 2013-083812 A | 5/2013 |
| JP | 2013-225026 A | 10/2013 |
| JP | 2013-232621 A | 11/2013 |
| WO | 2008/149989 A1 | 12/2008 |

# SUBSTRATE TREATMENT METHOD USING A BLOCK COPOLYMER CONTAINING A HYDROPHILIC AND A HYDROPHOBIC POLYMERS

CROSS REFERENCE TO RELATED APPLICATIONS

This application is based upon and claims the benefit of priority of the prior Japanese Patent Application No. 2014-194167, filed in Japan on Sep. 24, 2014, the entire contents of which are incorporated herein by reference.

TECHNICAL FIELD

The present invention relates to a substrate treatment method, a computer-readable storage medium and a substrate treatment system, using a block copolymer containing a hydrophilic (polar) polymer having a hydrophilic property (polarity) and a hydrophobic (nonpolar) polymer having a hydrophobic property (no polarity).

BACKGROUND ART

For example, in a manufacturing process of a semiconductor device, photolithography processing is performed in which a resist coating treatment of applying a resist solution onto, for example, a semiconductor wafer (hereinafter, referred to as a "wafer") to form a resist film, exposure processing of exposing the resist film to a predetermined pattern, a developing treatment of developing the exposed resist film and so on are performed in sequence to form a predetermined resist pattern on the wafer. Then, using the resist pattern as a mask, an etching treatment is performed on a film to be treated on the wafer and a removal treatment of the resist film is then performed, to form a predetermined pattern in the film to be treated.

Incidentally, for higher integration of the semiconductor device, miniaturization of the above-described pattern of the film to be treated is required in recent years. Therefore, the resist pattern is increasingly miniaturized and, for example, the wavelength of light for the exposure processing in the photolithography processing is increasingly shortened. However, there are technical and cost limits in shortening the wavelength of an exposure light source, and it is now difficult to form a fine resist pattern on the order of, for example, several nanometers only by the method of increasingly shortening the wavelength of light.

Hence, there is a proposed wafer treatment method using a block copolymer composed of two kinds of hydrophilic and hydrophobic block chains (polymers) (Patent Document 1). In this method, first, a guide is formed on the wafer, for example, by a resist pattern. Then, a block copolymer is applied onto the wafer, and a heat treatment is performed on the block copolymer to phase-separate the block copolymer into a hydrophilic polymer and a hydrophobic polymer. Thereafter, irradiation with an ultraviolet ray is performed on the wafer to modify the polymer. By supplying an organic solvent onto the wafer, the hydrophilic polymer is selectively removed. This forms a fine pattern of the hydrophobic polymer on the wafer.

PRIOR ART DOCUMENT

Patent Document

[Patent Document 1] Japanese Laid-open Patent Publication No. 2013-232621

DISCLOSURE OF THE INVENTION

Problems to be Solved by the Invention

However, the present inventors have confirmed that the pattern of the hydrophobic polymer after removing the hydrophilic polymer is sometimes not in a desired shape, namely, in a shape following the resist pattern as a guide.

On earnest investigation of the above point by the present inventors, it has been confirmed that the resist pattern has been deformed due to heat in the heat treatment of phase-separating the block copolymer into the hydrophilic polymer and the hydrophobic polymer. Thus, it is inferred that the phase-separation of the block copolymer occurs along the deformed resist pattern, resulting in formation of the pattern of the hydrophobic polymer in a shape different from the desired shape.

It is considered that the deformation of the resist pattern is caused from melting of the resist pattern because the heat treatment when phase-separating the block copolymer is performed at relatively high temperature, and therefore can be improved by decreasing the heating temperature. However, to diffuse the polymer of the block copolymer so as to appropriately perform the phase separation, the heating temperature cannot be decreased. Therefore, it is difficult to prevent the deformation of the resist pattern at present.

The present invention has been made in consideration of the above points, and its object is to appropriately form a predetermined pattern on a substrate in a substrate treatment using a block copolymer containing a hydrophilic polymer and a hydrophobic polymer.

Means for Solving the Problems

To achieve the above object, the present invention is a substrate treatment method of treating a substrate using a block copolymer containing a hydrophilic polymer and a hydrophobic polymer, the substrate treatment method including: a resist pattern formation step of forming a predetermined resist pattern by a resist film on the substrate; a thin film formation step of forming a thin film for suppressing deformation of the resist pattern on a surface of the resist pattern; a block copolymer coating step of applying a block copolymer to the substrate after the formation of the thin film; and a polymer separation step of phase-separating the block copolymer into the hydrophilic polymer and the hydrophobic polymer.

The present inventors have obtained knowledge that formation of a predetermined thin film on the surface of the resist pattern can suppress the deformation of the resist pattern when heated at the heating temperature in phase-separating the block copolymer. According to the present invention, the thin film is formed on the surface of the resist pattern after forming the resist pattern and before phase-separating the block copolymer, and thereby suppressing the deformation of the resist pattern during the heat treatment of phase-separating the block copolymer. Accordingly, the block copolymer can be phase-separated in a desired shape to appropriately form a predetermined pattern on a substrate.

According to the present invention in another aspect, there is provided a computer-readable storage medium storing a program running on a computer of a control unit controlling a substrate treatment system to cause the substrate treatment system to perform the substrate treatment method.

According to the present invention in still another aspect, there is provided a substrate treatment system of treating a substrate using a block copolymer containing a hydrophilic polymer and a hydrophobic polymer, the substrate treatment system including: a resist coating apparatus that applies a resist film on a substrate; a developing treatment apparatus that develops the resist film subjected to exposure processing to form a resist pattern; a thin film forming apparatus that forms a thin film for suppressing deformation of the resist pattern on a surface of the resist pattern; a block copolymer coating apparatus that applies the block copolymer to the substrate after the formation of the thin film; and a polymer separation apparatus that phase-separates the block copolymer into the hydrophilic polymer and the hydrophobic polymer.

Effect of the Invention

According to the present invention, a predetermined pattern can be appropriately formed on a substrate in a substrate treatment using a block copolymer containing a hydrophilic polymer and a hydrophobic polymer.

BEST MODE FOR CARRYING OUT THE INVENTION

Figure 1:
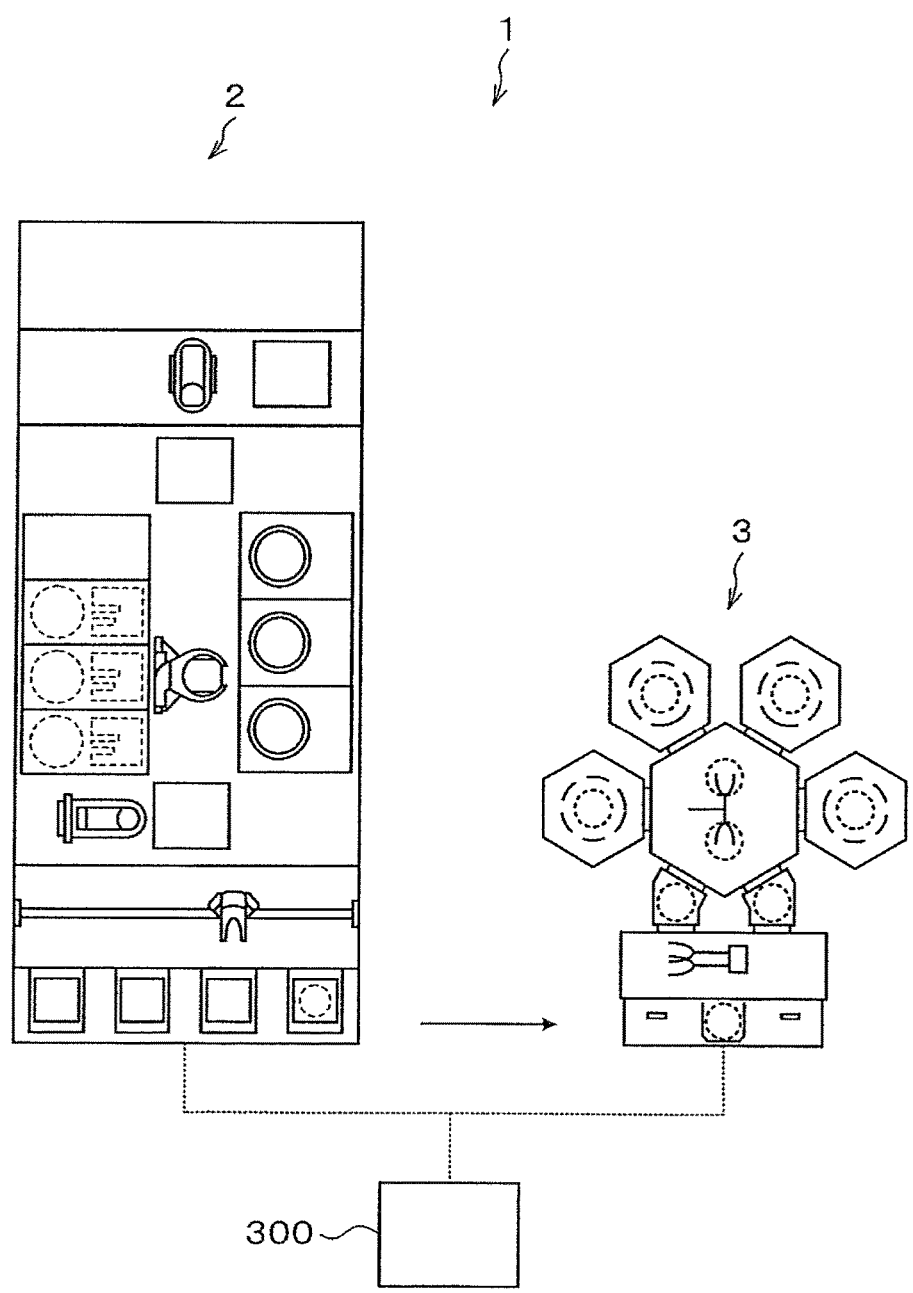
FIG. 1 A plan view illustrating the outline of a configuration of a substrate treatment system according to this embodiment.

Hereinafter, an embodiment of the present invention will be described. FIG. 1 is a plan view illustrating the outline of a configuration of a substrate treatment system 1 according to this embodiment.

The substrate treatment system 1 has a coating treatment apparatus 2 which performs a solution treatment such as a photolithography treatment on a wafer as a substrate, and a plasma processing apparatus 3 which performs plasma processing such as plasma etching processing on the wafer.

Figure 2:
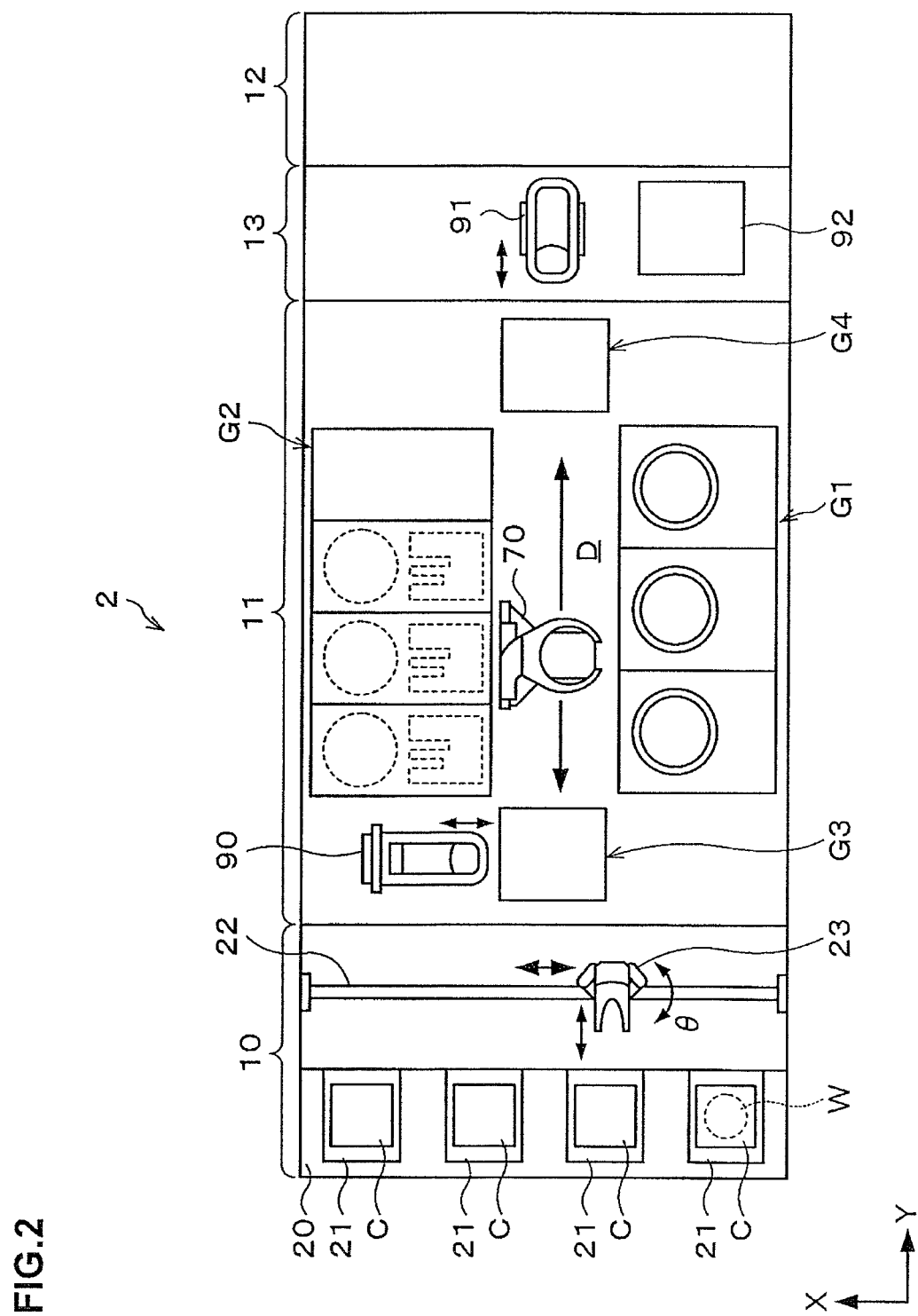
FIG. 2 A plan view illustrating the outline of a configuration of a coating treatment apparatus.

The coating treatment apparatus 2 has, as illustrated in FIG. 2, a configuration in which a cassette station 10 into/out of which a cassette C housing a plurality of wafers W is carried, a treatment station 11 including a plurality of various treatment apparatuses which perform predetermined treatments on the wafer W, and an interface station 13 which delivers the wafer W to/from an exposure apparatus 12 adjacent to the treatment station 11, are integrally connected.

In the cassette station 10, a cassette mounting table 20 is provided. The cassette mounting table 20 is provided with a plurality of cassette mounting plates 21 on which the cassettes C are mounted when the cassettes C are carried in/out from/to the outside of the substrate treatment system 1.

In the cassette station 10, a wafer carrier apparatus 23 is provided which is movable on a carrier path 22 extending in an X-direction as illustrated in FIG. 2. The wafer carrier apparatus 23 is movable also in a vertical direction and around a vertical axis (in a θ-direction), and can carry the wafer W between the cassette C on each of the cassette mounting plates 21 and a later-described delivery apparatus in a third block G3 in the treatment station 11.

In the treatment station 11, a plurality of, for example, four blocks G1, G2, G3, G4 are provided each including various apparatuses. For example, the first block G1 is provided on the front side (X-direction negative direction side in FIG. 2) in the treatment station 11, and the second block G2 is provided on the rear side (X-direction positive direction side in FIG. 2) in the treatment station 11. Further, the third block G3 is provided on the cassette station 10 side (Y-direction negative direction side in FIG. 2) in the treatment station 11, and the fourth block G4 is provided on the interface station 13 side (Y-direction positive direction side in FIG. 2) in the treatment station 11.

Figure 3:
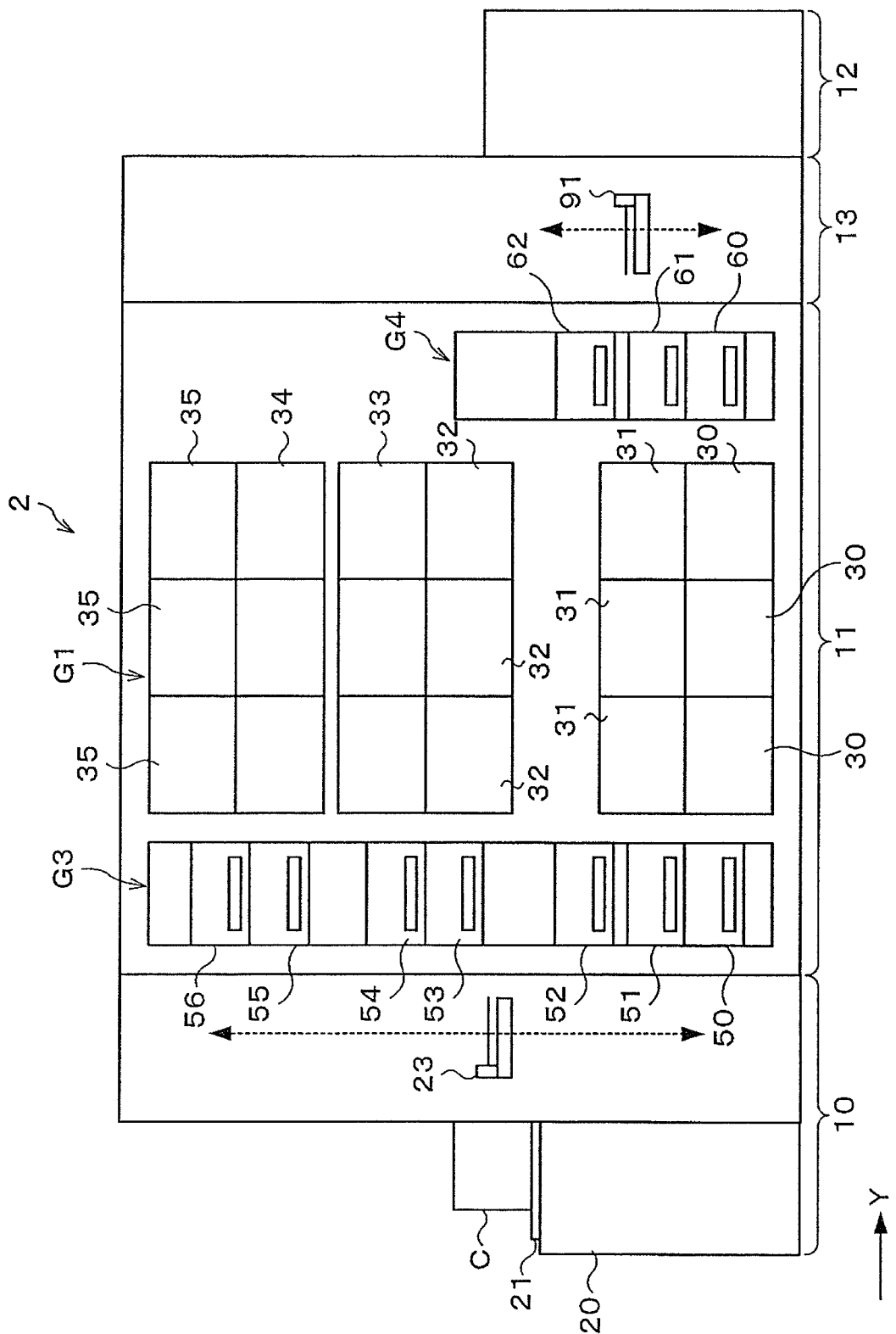
FIG. 3 A front view illustrating the outline of the configuration of the coating treatment apparatus.

For example, in the first block G1, as illustrated in FIG. 3, a plurality of solution treatment apparatuses, for example, developing apparatuses 30 each of which performs a developing treatment on the wafer W, organic solvent supply apparatuses 31 each of which supplies an organic solvent onto the wafer W, anti-reflection film forming apparatuses 32 each of which forms an anti-reflection film on the wafer W, neutral layer forming apparatuses 33 each of which applies a neutralizing agent onto the wafer W to form a neutral layer, resist coating apparatuses 34 each of which applies a resist solution onto the wafer W to form a resist film, and block copolymer coating apparatuses 35 each of which applies a block copolymer onto the wafer W, are stacked in order from the bottom.

For example, three each of the developing apparatus 30, the organic solvent supply apparatus 31, the anti-reflection film forming apparatus 32, the neutral layer forming apparatus 33, the resist coating apparatus 34, and the block copolymer coating apparatus 35 are arranged side by side in the horizontal direction. Note that the numbers and the arrangement of the developing apparatuses 30, the organic solvent supply apparatuses 31, the anti-reflection film forming apparatuses 32, the neutral layer forming apparatuses 33, the resist coating apparatuses 34, and the block copolymer coating apparatuses 35 can be arbitrarily selected.

In the developing apparatus 30, the organic solvent supply apparatus 31, the anti-reflection film forming apparatus 32, the neutral layer forming apparatus 33, the resist coating apparatus 34, and the block copolymer coating apparatus 35, for example, spin coating of applying a predetermined coating solution onto the wafer W is performed. In the spin coating, the coating solution is discharged, for example, from a coating nozzle onto the wafer W and the wafer W is rotated to diffuse the coating solution over the front surface of the wafer W.

Note that the block copolymer to be applied onto the wafer W in the block copolymer coating apparatus 35 is a macromolecule (copolymer) having a first polymer (a polymer of a first monomer) and a second polymer (a polymer of a second monomer) in which the first monomer and the second monomer are polymerized into a linear chain. As the first polymer, a hydrophilic polymer having a hydrophilic property (polarity) is used, and as the second polymer, a hydrophobic polymer having a hydrophobic property (no polarity) is used. In this embodiment, for example, polymethyl methacrylate (PMMA) is used as the hydrophilic polymer and, for example, polystyrene (PS) is used as the hydrophobic polymer. Further, the ratio of a molecular weight of the hydrophilic polymer in the block copolymer is about 20% to 40%, and the ratio of a molecular weight of the hydrophobic polymer in the block copolymer is about 80% to 60%. Besides, the block copolymer is obtained by making the copolymer of the hydrophilic polymer and the hydrophobic polymer into a solution by using a solvent.

Further, the neutral layer formed on the wafer W in the neutral layer forming apparatus 33 has an intermediate affinity to the hydrophilic polymer and the hydrophobic polymer. In this embodiment, for example, a random copolymer or an alternating copolymer of polymethyl methacrylate and polystyrene is used as the neutral layer. Hereinafter, "neutral" means the case having the intermediate affinity to the hydrophilic polymer and the hydrophobic polymer as described above.

Figure 4:
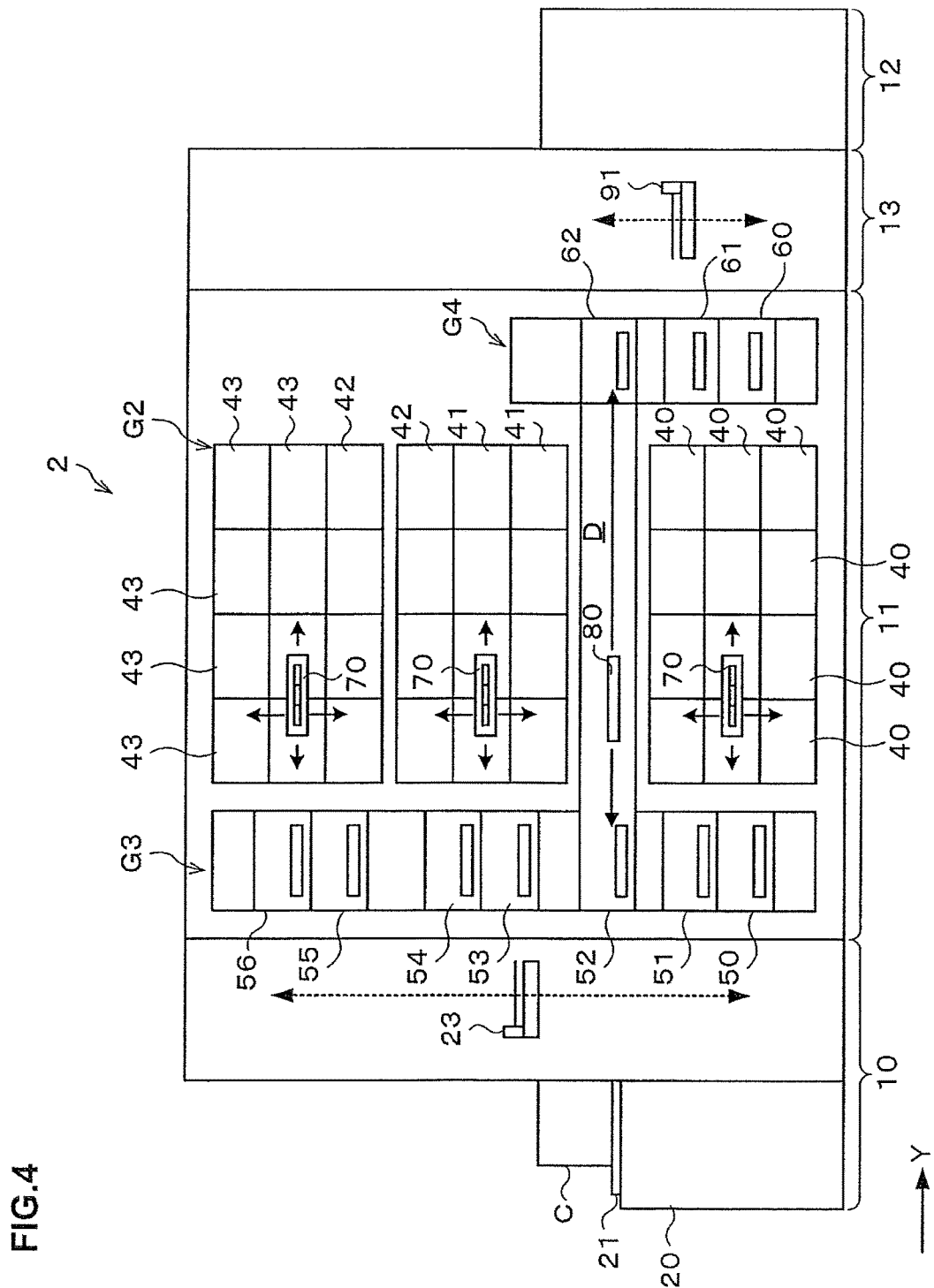
FIG. 4 A rear view illustrating the outline of the configuration of the coating treatment apparatus.

For example, in the second block G2, as illustrated in FIG. 4, thermal treatment apparatuses 40 each of which performs a thermal treatment on the wafer W, adhesion apparatuses 41 each of which performs a hydrophobic treatment on the wafer W, edge exposure apparatuses 42 each of which exposes the outer peripheral portion of the wafer W, ultraviolet irradiation apparatuses 43 each of which irradiates the wafer W with an ultraviolet ray, are arranged side by side in the vertical direction and in the horizontal direction. The thermal treatment apparatus 40 has a hot plate which mounts and heats the wafer W thereon and a cooling plate which mounts and cools the wafer W thereon, and thereby can perform both of a heat treatment and a cooling treatment. Note that a part of the plurality of thermal treatment apparatuses 40 serve as polymer separation apparatuses each of which phase-separates the block copolymer applied on the wafer W in the block copolymer coating apparatus 35 into the hydrophilic polymer and the hydrophobic polymer. The numbers and the arrangement of the thermal treatment apparatuses 40, the adhesion apparatuses 41, and the edge exposure apparatuses 42 can be arbitrarily selected.

For example, in the third block G3, a plurality of delivery apparatuses 50, 51, 52, 53, 54, 55, 56 are provided in order from the bottom. Further, in the fourth block G4, a plurality of delivery apparatuses 60, 61, 62 are provided in order from the bottom.

A wafer carry region D is formed in a region surrounded by the first block G1 to the fourth block G4 as illustrated in FIG. 2. In the wafer carry region D, for example, a plurality of wafer carrier apparatuses 70 are arranged each of which has a carrier arm that is movable, for example, in the Y-direction, the X-direction, the θ-direction, and the vertical direction. The wafer carrier apparatus 70 can move in the wafer carry region D to carry the wafer W to a predetermined apparatus in the first block G1, the second block G2, the third block G3 and the fourth block G4 therearound.

Further, in the wafer carry region D, a shuttle carrier apparatus 80 is provided which linearly carries the wafer W between the third block G3 and the fourth block G4.

The shuttle carrier apparatus 80 is configured to be linearly movable, for example, in the Y-direction. The shuttle carrier apparatus 80 can move in the Y-direction while supporting the wafer W, and carry the wafer W between the delivery apparatus 52 in the third block G3 and the delivery apparatus 62 in the fourth block G4.

As illustrated in FIG. 2, a wafer carrier apparatus 90 is provided adjacent on the X-direction positive direction side of the third block G3. The wafer carrier apparatus 90 has a carrier arm that is movable, for example, in the X-direction, the θ-direction, and the vertical direction. The wafer carrier apparatus 90 can move up and down while supporting the wafer W to carry the wafer W to each of the delivery apparatuses in the third block G3.

In the interface station 13, a wafer carrier apparatus 91 and a delivery apparatus 92 are provided. The wafer carrier apparatus 91 has a carrier arm that is movable, for example, in the Y-direction, the θ-direction, and the vertical direction. The wafer carrier apparatus 91 can carry the wafer W to/from each of the delivery apparatuses in the fourth block G4, the delivery apparatus 92 and the exposure apparatus 12, for example, while supporting the wafer W by the carrier arm.

Figure 5:
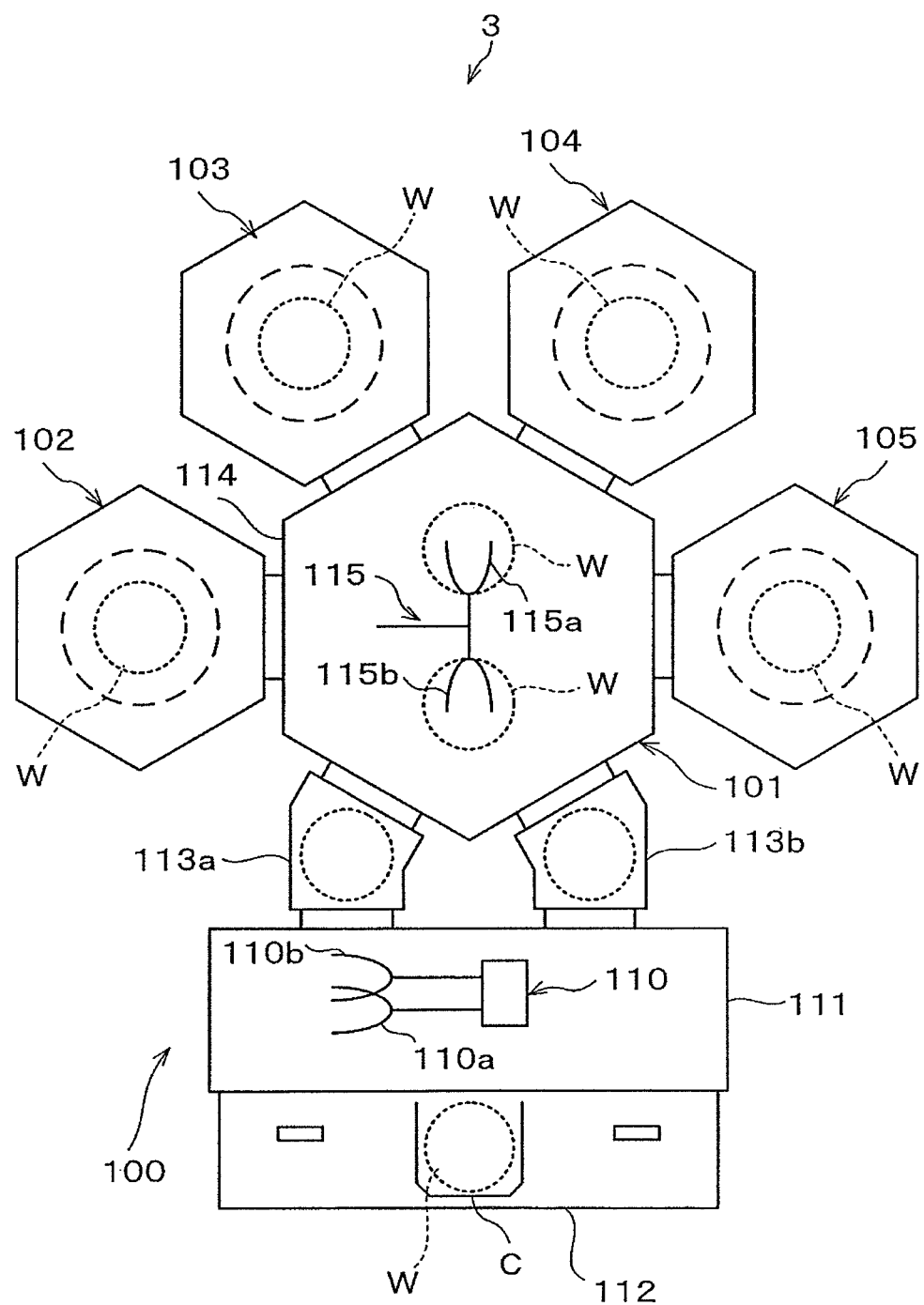
FIG. 5 A plan view illustrating the outline of a configuration of a plasma processing apparatus.

The plasma processing apparatus 3 has, as illustrated in FIG. 5, a cassette station 100 which carries the wafer W to/from the plasma processing apparatus 3, a common carrier unit 101 which carries the wafer W, etching apparatuses 102, 103 as polymer removing apparatuses each of which performs plasma etching processing on the wafer W to selectively remove either the hydrophilic polymer or the hydrophobic polymer, and thin film forming apparatuses 104, 105 each of which performs plasma processing on the wafer W to form a predetermined thin film on the resist pattern.

The cassette station 100 has a carrier room 111 which is provided with a wafer carrier mechanism 110 carrying the wafer W therein. The wafer carrier mechanism 110 has two carrier arms 110a, 110b each of which substantially horizontally holds the wafer W and is configured to carry the wafer W while holding the wafer W by one of the carrier arms 110a and 110b. On the lateral side of the carrier room 111, a cassette mounting table 112 is provided on which a cassette C capable of housing a plurality of wafers W arranged side by side therein is mounted. In the illustrated example, a plurality of, for example, three cassettes C can be mounted on the cassette mounting table 112.

The carrier room 111 and the common carrier unit 101 are coupled to each other via two load-lock apparatuses 113a and 113b which can be evacuated.

The common carrier unit 101 has a carrier room chamber 114 having a hermetically closable structure formed in a substantially polygonal shape (a hexagonal shape in the illustrated example) as seen from above. In the carrier room chamber 114, a wafer carrier mechanism 115 which carries the wafer W is provided. The wafer carrier mechanism 115 has two carrier arms 115a, 115b each of which substantially horizontally holds the wafer W and is configured to carry the wafer W while holding the wafer W by one of the carrier arms 115a and 115b.

Outside the carrier room chamber 114, the etching apparatuses 102, 103, the thin film forming apparatuses 104, 105, and the load-lock apparatuses 113a, 113b are arranged to surround the periphery of the carrier room chamber 114. The etching apparatuses 102, 103, the thin film forming apparatuses 104, 105, and the load-lock apparatuses 113a, 113b are arranged, for example, side by side in this order in the clockwise direction as seen from above and opposed to six side surface portions of the carrier room chamber 114 respectively.

Next, the thin film forming apparatus 104 will be described. The thin film forming apparatus 104 is a parallel-plate plasma type plasma processing apparatus and has a processing container 201 in a substantially cylindrical shape provided with a mounting table 200 on which the wafer W is to be mounted. The processing container 201 is electrically connected by a grounding line 202 and thereby grounded. Further, an inner wall of the processing container 201 is covered with a liner (not illustrated) having a sprayed coating made of a plasma resistant material formed on the surface.

The mounting table 200 includes an electrostatic chuck 203 in a substantially disc shape and a focus ring 204 in a substantially circular ring shape. The electrostatic chuck 203 is a member in a substantially circular plate shape and is formed, for example, by holding an electrode for the electrostatic chuck between a pair of ceramics.

At a lower surface of the electrostatic chuck 203, a susceptor 210 is provided as a lower electrode. The susceptor 210 is formed into a substantially disc shape made of metal such as aluminum. At a bottom of the processing container 201, a support table 212 is provided via an insulating plate 211, and the susceptor 210 is supported on an upper surface of the support table 212. In the electrostatic chuck 203, the electrode (not illustrated) is provided, and configured to be able to attract and hold the wafer W by an electrostatic force generated by applying a DC voltage to the electrode.

The focus ring 204 for improving the uniformity of the plasma processing is formed of, for example, a conductive silicon made of silicon, and arranged on an upper surface of the susceptor 210 and at an outer peripheral portion of the electrostatic chuck 203. The susceptor 210 and the support table 212 have outer side surfaces covered with a cylindrical member 213 made of, for example, quartz.

Inside the support table 212, a refrigerant flow path (not illustrated) in which a refrigerant flows is provided, so that the temperature of the refrigerant is controlled to control the temperature of the wafer W held on the electrostatic chuck 203.

To the susceptor 210, a first high-frequency power supply 230 which supplies high-frequency power to the susceptor 210 to generate plasma, is electrically connected via a first matching device 231. The first high-frequency power supply 230 is configured to output a high-frequency power of, for example, a frequency of 27 MHz to 100 MHz, for example, 100 MHz in this embodiment. Further, an internal impedance and a load impedance of the first high-frequency power supply 230 are matched with each other by the first matching device 231.

To the susceptor 210, a second high-frequency power supply 240 which supplies high-frequency power to the susceptor 210 and thereby applies a bias to the wafer W to draw ions into the wafer W, is also electrically connected via a second matching device 241. The second high-frequency power supply 240 is configured to output a high-frequency power of, for example, a frequency of 400 kHz to 13.56 MHz, for example, 3.2 MHz in this embodiment. The second matching device 241 matches, as with the first matching device 231, an internal impedance and a load impedance of the second high-frequency power supply 240.

The first high-frequency power supply 230, the first matching device 231, the second high-frequency power supply 240, and the second matching device 241 are connected to a later-described control unit 300 so that their operations are controlled by the control unit 300.

Above the susceptor 210 being the lower electrode, an upper electrode 242 is provided facing and being in parallel with the susceptor 210. The upper electrode 242 is supported on an upper portion of the processing container 201 via a conductive holding member 243, and is at the ground potential as with the processing container 201.

The upper electrode 242 is composed of an electrode plate 250 which forms a surface facing the wafer W held by the electrostatic chuck 203, and an electrode support 251 which supports the electrode plate 250 from above. The electrode plate 250 has a plurality of gas supply ports 252 which supply processing gas into the processing container 201 and are formed through the electrode plate 250. The electrode plate 250 is made of an low-resistance electric conductor or semiconductor containing silicon and having less Joule heat. Further, the electrode support 251 is made of an electric conductor, and, for example, aluminum is used in this embodiment.

At a central portion inside the electrode support 251, a gas diffusion room 260 formed in a substantially disc shape is provided. Further, at a lower portion of the electrode support 251, a plurality of gas holes 261 are formed extending downward from the gas diffusion room 260, and the gas supply ports 252 are connected to the gas diffusion room 260 via the gas holes 261.

Figure 6:
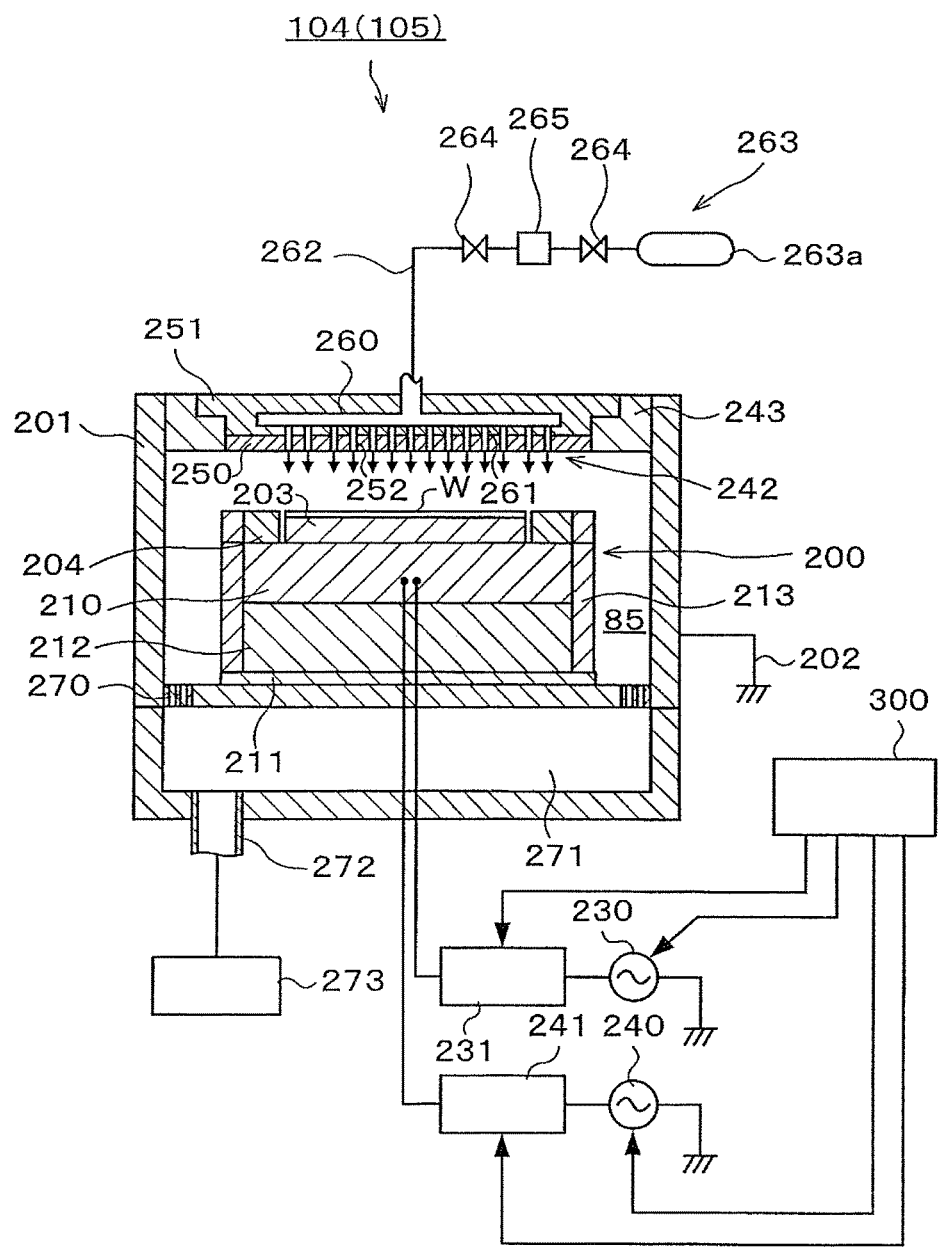
FIG. 6 A longitudinal cross-sectional view illustrating the outline of a configuration of a thin film forming apparatus.

To the gas diffusion room 260, a gas supply pipe 262 is connected. To the gas supply pipe 262, a processing gas supply source 263 is connected as illustrated in FIG. 6 so that the processing gas supplied from the processing gas supply source 263 is supplied to the gas diffusion room 260 via the gas supply pipe 262. The processing gas supplied to the gas diffusion room 260 is introduced into the processing container 201 via the gas holes 261 and the gas supply ports 252.

The processing gas supply source 263 includes a gas supply unit 263a which supplies a processing gas for plasma processing. The processing gas supply source 263 further includes a valve 264 provided between the gas supply unit 263a and the gas diffusion room 260, and a flow rate regulating mechanism 265 which controls the flow rate of the gas to be supplied to the gas diffusion room 260.

A bottom surface of the processing container 201 is provided with an exhaust port 270. Below the exhaust port 270, an exhaust room 271 is formed, and an exhaust apparatus 273 is connected to the exhaust room 271 via an exhaust pipe 272. Therefore, by driving the exhaust apparatus 273, the atmosphere in the processing container 201 can be exhausted via the exhaust port 270 to reduce the pressure in the processing room down to a predetermined vacuum degree.

Note that the thin film forming apparatus 105 has the same configuration as that of the thin film forming apparatus 104, and the etching apparatuses 102, 103 also have the same configuration as the configuration of the thin film forming apparatus 104 except that the processing gas in use is different, and therefore description thereof will be omitted.

In the above substrate treatment system 1, the control unit 300 is provided as illustrated in FIG. 1. The control unit 300 is, for example, a computer and has a program storage unit (not illustrated). In the program storage unit, a program that controls the treatments on the wafer W in the substrate treatment system 1 is stored. Further, the program storage unit also stores a program that controls the operations of the above-described various treatment apparatuses and a driving system such as the carrier apparatuses to realize a later-described treatment in the substrate treatment system 1. Note that the programs may be the ones which are recorded, for example, in a computer-readable storage medium such as a computer-readable hard disk (HD), flexible disk (FD), compact disk (CD), magneto-optical disk (MO), or memory card, and installed from the storage medium into the control unit 300.

Figure 7:
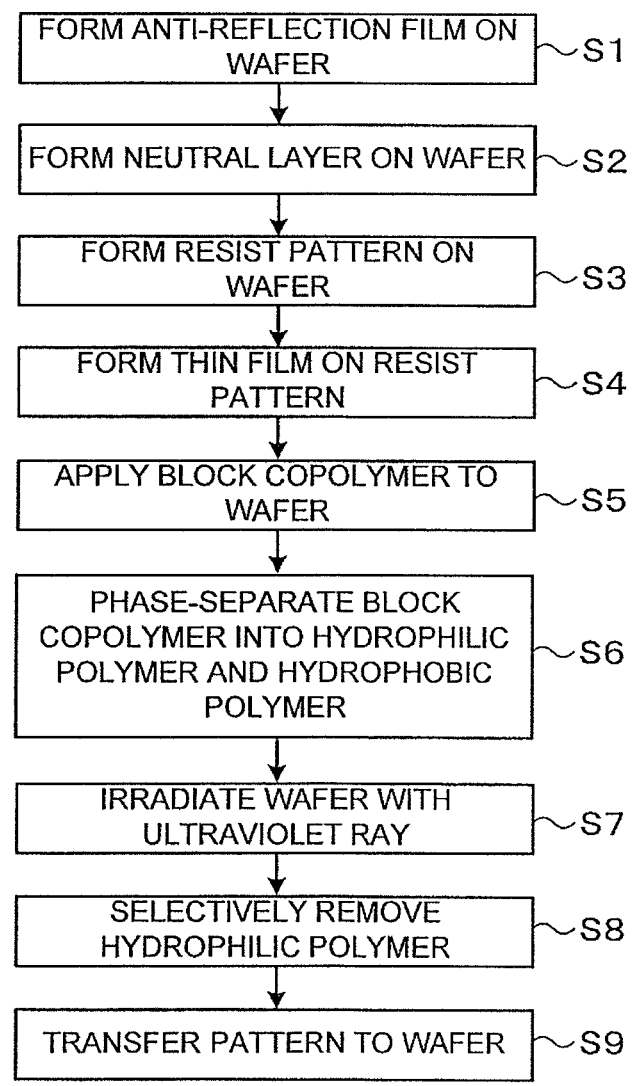
FIG. 7 A flowchart illustrating main steps of a wafer treatment.

Next, a wafer treatment performed using the substrate treatment system 1 configured as described above will be described. FIG. 7 is a flowchart illustrating examples of main steps of the wafer treatment.

First, the cassette C housing a plurality of wafers W is carried into the cassette station 10 of the coating treatment apparatus 2 and the wafers W in the cassette C are successively carried by the wafer carrier apparatus 23 to the delivery apparatus 53 in the treatment station 11.

Figure 8:
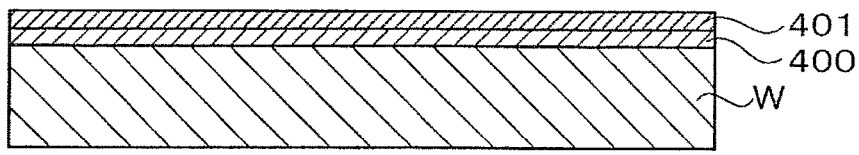
FIG. 8 An explanatory view of a longitudinal cross-section illustrating an appearance in which an anti-reflection film and a neutral layer are formed on a wafer.

The wafer W is then carried to the thermal treatment apparatus 40 and temperature-regulated, and then carried to the anti-reflection film forming apparatus 32, in which an anti-reflection film 400 is formed on the wafer W as illustrated in FIG. 8 (Step S1 in FIG. 7). Note that the wafer W is then carried to the thermal treatment apparatus 40 and heated and temperature-regulated.

The wafer W is then carried to the neutral layer forming apparatus 33, in which the neutralizing agent is applied onto the anti-reflection film 400 on the wafer W as illustrated in FIG. 8 to form a neutral layer 401 (Step S2 in FIG. 7). Thereafter, the wafer W is carried to the thermal treatment apparatus 40 and heated and temperature-regulated.

The wafer W is then carried to the adhesion unit 41 and subjected to an adhesion treatment. The wafer W is then carried to the resist coating apparatus 34, in which the resist solution is applied onto the neutral layer 401 of the wafer W to form a resist film. Thereafter, the wafer W is carried to the thermal treatment apparatus 40 and subjected to a pre-baking treatment. The wafer W is then carried to the edge exposure apparatus 42 and subjected to edge exposure processing.

Figure 9:
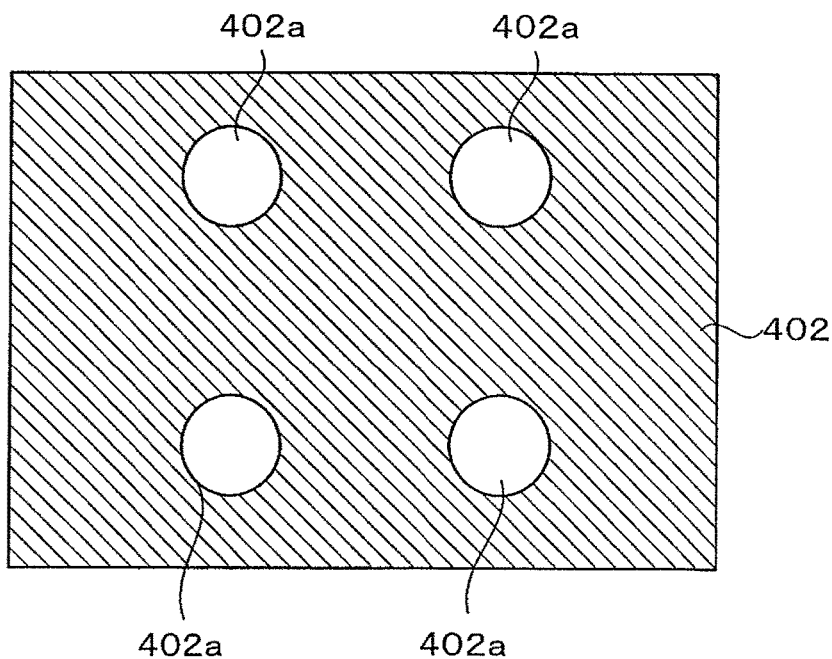
FIG. 9 An explanatory view of a planar view illustrating an appearance in which a resist pattern is formed on the neutral layer.
Figure 10:
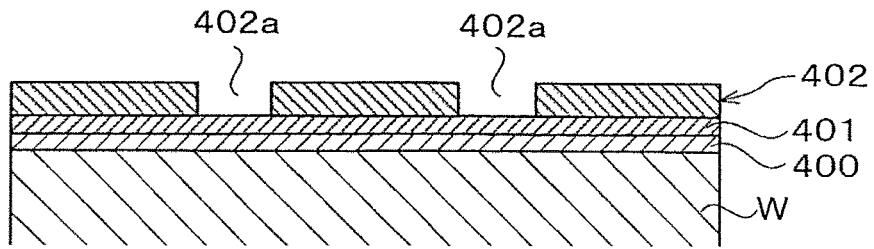
FIG. 10 An explanatory view of a longitudinal cross-section illustrating the appearance in which the resist pattern is formed on the neutral layer.

Thereafter, the wafer W is carried by the wafer carrier apparatus 91 in the interface station 13 to the exposure apparatus 12 and subjected to exposure processing. The wafer W is then carried to the thermal treatment apparatus 40 and subjected to a post-exposure baking treatment. The wafer W is thereafter carried to the developing apparatus 30 and subjected to a developing treatment. After the development ends, the wafer W is carried to the thermal treatment apparatus 40 and subjected to a post-baking treatment. Thus, a predetermined resist pattern 402 by the resist film is formed on the neutral layer 401 of the wafer W as illustrated in FIG. 9, FIG. 10 (Step S3 in FIG. 7). The resist pattern 402 in this embodiment is a pattern in which a plurality of circular hole portions 402a are arranged in a lattice form in a planar view.

Thereafter, the wafer W is carried by the wafer carrier apparatus 70 to the delivery apparatus 50, and then carried by the wafer carrier apparatus 23 in the cassette station 10 to the cassette C on the predetermined mounting plate 21. The cassette C housing wafers W is carried out of the coating treatment apparatus 2 and then carried into the plasma processing apparatus 3.

In the plasma processing apparatus 3, one wafer W is first taken out of the cassette C on the cassette mounting table 112 by the wafer carrier mechanism 110 and carried into the load-lock apparatus 113a. The wafer W is then carried by the wafer carrier mechanism 115 out of the load-lock apparatus 113a and to the thin film forming apparatus 104 via the carrier room chamber 114.

Figure 11:
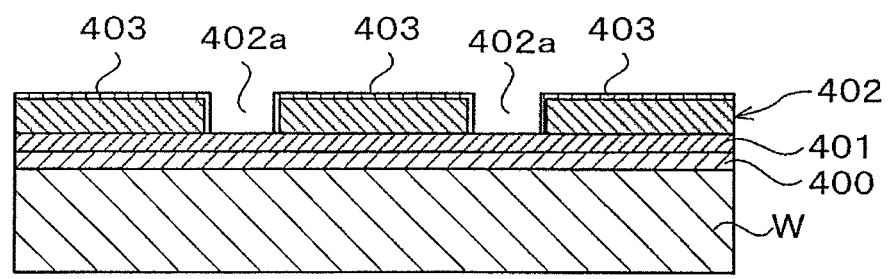
FIG. 11 An explanatory view of a longitudinal cross-section illustrating an appearance in which a thin film is formed on the resist pattern.

In the thin film forming apparatus 104, the wager W is first mounted and held on the electrostatic chuck 203. Then, for example, an Ar gas for plasma generation as the processing gas is supplied from the processing gas supply source 263 into the processing container 201. Thereafter, the high-frequency power is continuously applied by the first high-frequency power supply 230 and the second high-frequency power supply 240 to the susceptor 210 being the lower electrode, thereby forming a high-frequency electric field between the upper electrode 242 and the electrostatic chuck 203. This generates plasma in the processing container 201 and the plasma sputters the electrode plate 250 of the upper electrode 242. The material of the sputtered electrode plate is supplied to the surface of the wafer W, so that the resist pattern 402 on the wafer W is modified by the plasma, and a thin film 403 derived from the material of the electrode plate 250, namely, a thin film 403 containing silicon is formed on the resist pattern 402 as illustrated in FIG. 11 (Step S4 in FIG. 7). The material of the thin film 403 is, for example, SiO, $SiO_2$, SiOC or the like. Besides, a preferable thickness of the thin film 403 is approximately 5 nm or less, more preferably approximately 2 nm to 3 nm. Note that the present inventors have confirmed that the film formation can be efficiently performed by supplying a $H_2$ gas in addition to the inert gas (the Ar gas in this embodiment) as the gas for plasma generation when forming the thin film 403 on the resist pattern 402 in the thin film forming apparatus 104. This is conceivable because the sputtering of the electrode plate 250 is promoted by adding the $H_2$ gas in addition to the inert gas for plasma generation. Accordingly, it is preferable to supply the $H_2$ gas in addition to the inert gas in the plasma processing in the thin film forming apparatus 104.

The wafer W is then delivered by the wafer carrier mechanism 115 again to the wafer carrier mechanism 110 via the carrier room chamber 114 and the load-lock apparatus 113b, and then housed in the cassette C. The cassette C housing wafers W is carried out of the plasma processing apparatus 3 and carried again into the coating treatment apparatus 2.

Figure 12:
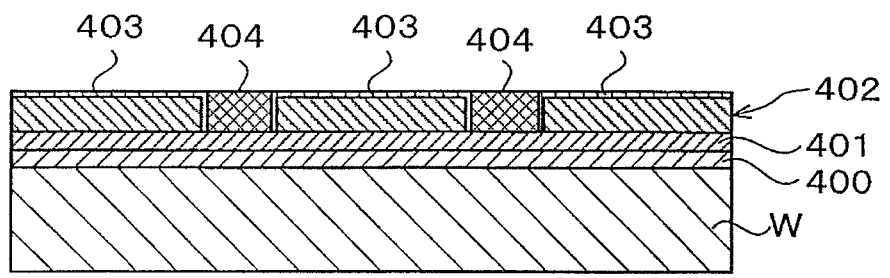
FIG. 12 An explanatory view of a longitudinal cross-section illustrating an appearance in which a block copolymer is applied on the wafer after the formation of the thin film.

The wafer W carried into the coating treatment apparatus 2 is carried to the block copolymer coating apparatus 35. In the block copolymer coating apparatus 35, a block copolymer 404 is applied on the resist pattern 402 on which the thin film 403 has been formed as illustrated in FIG. 12 (Step S5 in FIG. 7).

Figure 13:
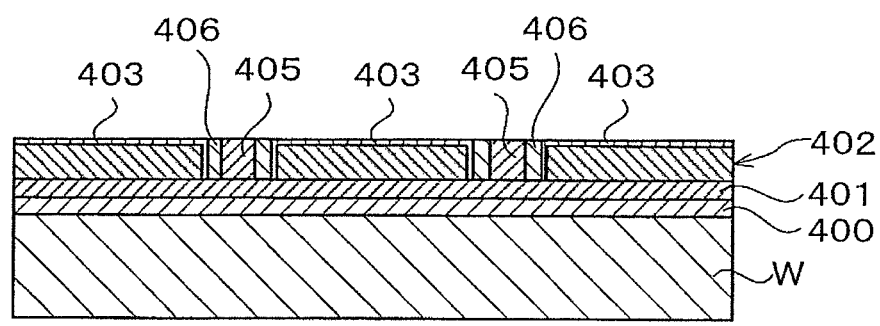
FIG. 13 An explanatory view of a longitudinal cross-section illustrating an appearance in which the block copolymer is phase-separated into a hydrophilic polymer and a hydrophobic polymer.
Figure 14:
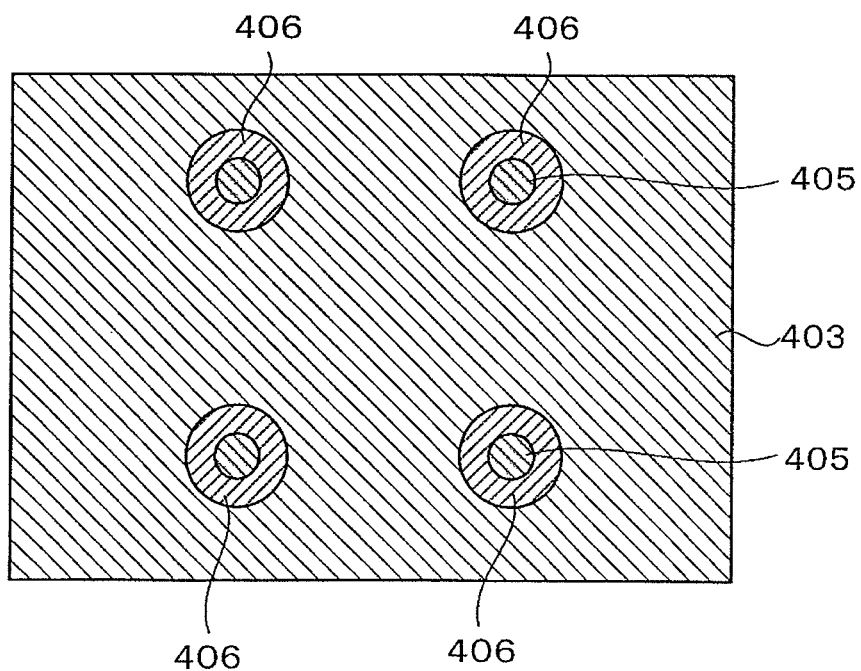
FIG. 14 An explanatory view of a plane illustrating the appearance in which the block copolymer is phase-separated into the hydrophilic polymer and the hydrophobic polymer.

The wafer W is then carried to the thermal treatment apparatus 40 as the polymer separation apparatus. In the thermal treatment apparatus 40, a thermal treatment is performed on the wafer W at approximately 200° C. to 300° C. as a predetermined temperature, for example, 260° C. in this embodiment. Thus, the block copolymer 404 on the wafer W is phase-separated into the hydrophilic polymer 405 and the hydrophobic polymer 406 as illustrated in FIG. 13 and FIG. 14 (Step S6 in FIG. 7).

Here, as described above, the ratio of a molecular weight of the hydrophilic polymer 405 is 20% to 40%, and the ratio of a molecular weight of the hydrophobic polymer 406 is 80% to 60% in the block copolymer 404. Then, in Step S6, as illustrated in FIG. 13 and FIG. 14, the columnar hydrophilic polymer 405 is phase-separated at the center of each of the hole portions 402a of the resist pattern 402. The hydrophobic polymer 406 is phase-separated in a cylindrical shape to be concentric with the hydrophilic polymer 405 in a manner to surround the outer periphery of the hydrophilic polymer 405.

Further, the thin film 403 containing silicon formed on the surface of the resist pattern 402 before performing the phase separation can suppress deformation of the resist pattern 402 even if the resist pattern 402 melts during the thermal treatment accompanying the phase separation. Accordingly, keeping the resist pattern 402 in a desired shape makes it possible to phase-separate the hydrophilic polymer 405 and the hydrophobic polymer 406 into desired shapes.

The wafer W is then carried to the ultraviolet irradiation apparatus 43. In the ultraviolet irradiation apparatus 43, irradiation of the wafer W with the ultraviolet ray cuts the bonding chain of polymethyl methacrylate being the hydrophilic polymer 405 and causes a cross-linking reaction of polystyrene being the hydrophobic polymer 406 (Step S7 in FIG. 7).

Figure 15:
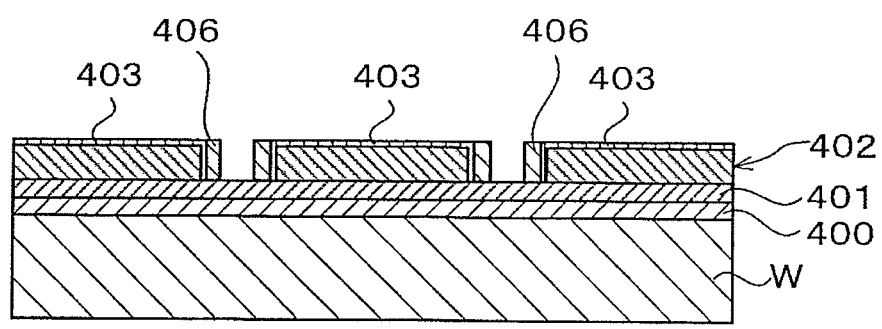
FIG. 15 An explanatory view of a longitudinal cross-section illustrating an appearance in which the hydrophilic polymer is selectively removed from the block copolymer after the phase separation.

The wafer W is then carried by the wafer carrier apparatus 70 to the organic solvent supply apparatus 31. In the organic solvent supply apparatus 31, an organic solvent having a polarity, for example, IPA (isopropyl alcohol) or the like is supplied to the wafer W, so that the hydrophilic polymer 405 whose bonding chain has been cut by the irradiation with the ultraviolet ray is selectively dissolved and removed. As a result, for example, a predetermined pattern of the hydrophobic polymer 406 is formed as illustrated in FIG. 15 (Step S8 in FIG. 7).

Thereafter, the wafer W is carried by the wafer carrier apparatus 70 to the delivery apparatus 50, and then carried by the wafer carrier apparatus 23 in the cassette station 10 to the cassette C on the predetermined mounting plate 21.

Thereafter, the cassette C is carried to the plasma processing apparatus 3 provided in the substrate treatment system 1, and an etching treatment is performed on the wafer W in the etching apparatus 102 using the resist pattern 402 and the hydrophobic polymer 406 as a mask. Thus, the predetermined pattern is transferred to the wafer W (Step S9 in FIG. 7).

Thereafter, the hydrophobic polymer 406 and resist pattern 402 are removed, whereby the predetermined pattern is formed on the wafer W.

The wafer W is thereafter housed in the cassette C, and the cassette C housing wafers W is carried out of the plasma processing apparatus 3, with which a series of wafer treatment ends.

According to the above embodiment, the thin film 403 is formed on the surface of the resist pattern 402 after the resist pattern 402 is formed in Step S3 and before phase-separation of the block copolymer 404 is performed (Step S6), so that even if the resist pattern 402 melts during the thermal treatment of phase-separating the block copolymer 404, the thin film 403 can suppress deformation of the resist pattern 402. Accordingly, it is possible to phase-separate the block copolymer 404 in a state along the resist pattern 402 in the desired shape and thereby appropriately form the predetermined pattern on the wafer W.

Note that FIG. 11 illustrates a state in which the thin film 403 is formed on the entire surface of the resist pattern 402. However, the present inventors have confirmed that it is not always necessary to cover the entire surface of the resist pattern 402 with the thin film 403 in order to suppress deformation of the of the resist pattern 402 during phase separation in Step S6, and it is possible to suppress deformation of the resist pattern 402 by forming even a punching metal film having holes opened in places or a net-shape or honeycomb-shape film on the surface of the resist pattern 402.

Further, the present inventors have confirmed that the material of the thin film 403 is not limited to the film containing silicon, but even a metal film formed of W (tungsten), Ti (titanium), TiN (titanium nitride) or the like can suppress deformation of the resist pattern 402. The metal film may be formed, for example, by a CVD (Chemical Vapor Deposition) processing apparatus performing CVD processing or an ALD (Atomic Layer Deposition) processing apparatus performing ALD processing.

Further, though the thin film 403 containing silicon is formed by the plasma processing in the above embodiment, thin film 403 containing silicon may also be formed by the ALD processing. The method of forming the thin film 403 can be arbitrarily selected as long as, when the block copolymer 404 is phase-separated, a thin film 403 can be formed in a thickness never affecting the dimension of the pattern to be formed of the hydrophobic polymer 406, specifically, about 5 nm or less, preferably, about 2 nm to 3 nm.

Note that though the thin film 403 is formed to prevent the deformation of the resist pattern 402 in Step S6 in the above embodiment, silylation of the resist pattern 402 being a publicly-known technique may be performed or hardening of the resist pattern 402 may be performed by supplying a treatment solution containing metal to the resist pattern 402 to cause the metal infiltrate thereinto, other than the formation of the thin film 403 from the viewpoint of preventing the deformation of the resist pattern 402.

Note that though the case where the pattern in the columnar shape is formed of the hydrophobic polymer 406 using the resist pattern 402 having the hole portion 402a has been described as an example in the above embodiment, but the shape of the resist pattern 402 is not limited to the aspect of the embodiment, and, for example, a so-called line-and-space resist pattern 402 having a linear line and a linear space in a planar view may be used. In this case, a block copolymer having a ratio of the molecular weight of the hydrophilic polymer 405 of 40% to 60% and the ratio of the molecular weight of the hydrophobic polymer 406 of 60% to 40% is used as the block copolymer 404. This can form a pattern in a so-called lamellar structure in which an odd number of hydrophilic polymers 405 and an odd number of hydrophobic polymers 406 are alternately arranged in the space portion of the resist pattern.

Besides, though the anti-reflection film 400 and the neutral layer 401 are formed as the base film of the resist pattern 402 in the above embodiment, these are not always necessary. In particular, the neutral layer 401 is used for arraying the hydrophilic polymers 405 and the hydrophobic polymers 406 along the normal direction to the wafer W when the block copolymer is phase-separated. Therefore, the neutral layer 401 does not always need to be provided as long as the base of the resist pattern 402 is neutral to the hydrophilic polymer and the hydrophobic polymer even in the case where the neutral layer 401 is not provided, or as long as even if the base is not neutral, the hydrophilic polymer 405 and the hydrophobic polymer 406 are properly phase-separated. In this case, the base of the resist pattern 402, namely, the face coated to be with the block copolymer 404 may be, for example, the anti-reflection film 400.

A preferred embodiment of the present invention has been described above with reference to the accompanying drawings, but the present invention is not limited to the embodiment. It should be understood that various changes and modifications are readily apparent to those skilled in the art within the scope of the spirit as set forth in claims, and those should also be covered by the technical scope of the present invention. The present invention is not limited to the embodiment but can take various forms. The present invention is also applicable to the case where the substrate is a substrate other than the wafer, such as an FPD (Flat Panel Display), a mask reticle for a photomask or the like.

INDUSTRIAL APPLICABILITY

The present invention is useful in treating a substrate, for example, using a block copolymer containing a hydrophilic polymer having a hydrophilic property and a hydrophobic polymer having a hydrophobic property.

EXPLANATION OF CODES

1 substrate treatment apparatus
2 coating treatment apparatus
3 plasma processing apparatus
30 developing apparatus
31 organic solvent supply apparatus
32 anti-reflection film forming apparatus
33 neutral layer forming apparatus
34 resist coating apparatus
35 block copolymer coating apparatus
40 thermal treatment apparatus
104, 105 thin film forming apparatus
300 control unit
400 anti-reflection film
401 neutral layer
402 resist pattern
403 thin film
404 block copolymer
405 hydrophilic polymer
406 hydrophobic polymer
W wafer

What is claimed:

1. A substrate treatment method of treating a substrate using a block copolymer containing a hydrophilic polymer and a hydrophobic polymer, the substrate treatment method comprising:
   a resist pattern formation step of forming a predetermined resist pattern by a resist film on the substrate;
   a thin film formation step of forming a thin film of 2 nm to 3 nm thickness for suppressing deformation of the resist pattern to cover a surface of the resist pattern with the thin film, wherein the thin film is a silicon-containing film;
   a block copolymer coating step of applying a block copolymer to the substrate after the formation of the thin film; and
   a polymer separation step of phase-separating the block copolymer into the hydrophilic polymer and the hydrophobic polymer.

2. The substrate treatment method according to claim 1, wherein the silicon-containing film is formed by plasma processing, and
   wherein the plasma processing is performed by applying high-frequency power to an electrode containing silicon.

3. The substrate treatment method according to claim 1, wherein the silicon-containing film is SiO, $SiO_2$, or SiOC.

* * * * *